US006992336B2

(12) United States Patent
Lee

(10) Patent No.: US 6,992,336 B2
(45) Date of Patent: Jan. 31, 2006

(54) FRONT SUBSTRATE OF PLASMA DISPLAY PANEL AND FABRICATION METHOD THEREOF

(75) Inventor: Sung-Wook Lee, Gyeoggi-Do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/760,454

(22) Filed: Jan. 21, 2004

(65) Prior Publication Data

US 2004/0150341 A1 Aug. 5, 2004

(30) Foreign Application Priority Data

Jan. 27, 2003 (KR) ..................... 10-2003-0005307

(51) Int. Cl.
*H01L 29/22* (2006.01)

(52) U.S. Cl. ............................ 257/98; 257/79; 438/22; 438/25; 438/26; 438/27; 438/29

(58) Field of Classification Search .................. 257/79, 257/98; 438/22, 25, 26, 27, 29
See application file for complete search history.

(56) References Cited

U.S. PATENT DOCUMENTS

| | | | | |
|---|---|---|---|---|
| 5,714,840 | A * | 2/1998 | Tanabe et al. | 313/581 |
| 5,948,537 | A * | 9/1999 | Onoda et al. | 428/426 |
| 6,589,894 | B1 * | 7/2003 | Mito et al. | 501/17 |
| 6,607,999 | B2 * | 8/2003 | Hachitani | 501/69 |
| 6,797,413 | B2 * | 9/2004 | Takeishi et al. | 428/690 |
| 2003/0102477 | A1 * | 6/2003 | Lee | 257/72 |

* cited by examiner

*Primary Examiner*—Nathan J. Flynn
*Assistant Examiner*—Scott R. Wilson
(74) *Attorney, Agent, or Firm*—Fleshner & Kim, LLP

(57) ABSTRACT

A front substrate for a plasma display panel (PDP) and an associated fabrication method are provided. An upper dielectric layer of the front substrate includes a colorant, which causes the dielectric layer to also act as a color filter. The resulting front substrate enhances at least one of color temperature, color purity, or contrast of the PDP without increasing complexity or cost.

23 Claims, 4 Drawing Sheets

FRONT SUBSTRATE OF PLASMA DISPLAY PANEL AND FABRICATION METHOD THEREOF

BACKGROUND OF THE INVENTION

1. Field of the Invention

The present invention relates to a plasma display panel (PDP) and, more particularly, to a front substrate of the PDP and its fabrication method.

2. Description of the Background Art

In general, with the development and growing spread of in an information processing system, an importance of a next-generation multimedia display device as a visual information transmission means is increasing. Especially, because a conventional CRT (Cathode Ray Tube) fails to go with the recent tendency aiming at a large and flat screen, researches on an LCD (Liquid Crystal Display), an FED (Field Emission Display), a PDP (Plasma Display Panel), and an EL (ElectroLuminesence) are actively ongoing.

As a self-emission display device using a plasma gas discharge, the PDP is advantageous in that it can be enlarged in size, its picture quality is excellent and an image response speed is fast.

In addition, the PDP receives an attention in the market as a wall-mounted display device together with the LCD or the like.

A discharge cell of a three-electrode AC surface discharge type PDP having such characteristics will now be described with reference to FIG. 1.

FIG. 1 illustrates a structure of a general three-electrode AC surface discharge type PDP.

As shown in FIG. 1, the general three-electrode AC surface discharge PDP is constructed such that a front substrate 10 and a back substrate 20 are coupled and a discharge gas is injected therebetween.

The front substrate 10 includes: an upper glass substrate 11; transparent electrode 12 and bus electrode 13 formed on the glass substrate; an upper dielectric layer 14 formed entirely on the transparent and bus electrode-formed upper glass substrate 11; and a protection layer 15 formed on the upper dielectric layer 14.

The upper dielectric layer 14 serves to limit a plasma discharge current and accumulate a wall charge when plasma is discharged.

The back substrate 20 includes: a lower glass substrate 25; an address electrode 24 formed on the lower glass substrate 25; a lower dielectric layer 23 formed entirely on the address electrode-formed lower glass substrate 25; a barrier rib 22 formed on the lower dielectric layer 23; and a phosphor 21 formed entirely on the lower dielectric layer 23 and the barrier rib 22.

The operation principle of the general PDP constructed as described above will now be explained.

First, as a discharge sustain voltage is applied to the transparent electrode 12 and the bus electrode 13, charges are accumulated on the upper dielectric layer 14, and as a discharge starting voltage is applied to the address electrode 24, a discharge gas comprising He, Ne and Xe or the like injected in each discharge cell of the PDP is separated to electron and ion to turn to plasma.

Thereafter, in the PDP, when the phosphor 21 is excited by ultraviolet generated at a moment when the electron and ion are re-coupled, a visible light is generated by which a character or a graphic is displayed. Herein, in order to prevent thermal deformation of the dielectric layer or the phosphor 21 caused as the accelerated gas ions collide with each other, the PDP uses Ne gas having a relatively greater molecular weight as a principal component.

However, since Ne gas generates an orange-colored visible light (585 nm) when discharged, color purity and a contrast of the PDP deteriorate.

In order to avoid such a problem, a PDP having a color filter layer or a black strip layer additionally formed on the upper substrate has been proposed.

FIG. 2 is a sectional view showing a front substrate of the PDP in accordance with a conventional art.

As shown in FIG. 2, the front substrate of the conventional PDP includes an upper substrate 11; transparent electrode 12 and bus electrode 13 formed on the upper glass substrate 11; an upper dielectric layer 14 formed on the transparent and bus electrode-formed upper glass substrate 11; a color filter layer 14A formed on the upper dielectric layer 14; and a protection layer 15 formed on the color filter layer 14A. The color filter layer 14A can control a light transmittance and prevent a surface reflection by an external light.

Accordingly, in the conventional PDP, the color purity of the PDP can be enhanced by controlling the light transmittance of a color filter by virtue of the color filter layer, and the contrast of the PDP can be enhanced by preventing a surface reflection by an external light.

However, in the conventional PDP, formation of the color filter layer on the upper dielectric layer of the PDP complicates a fabrication process of the PDP.

In addition, in the conventional PDP, since the light transmittance of a blue (B) visible light is relatively low compared to the red (R) and green (G) visible light, the color temperature of the PDP is approximately 6000K. Thus, in order to compensate the low color temperature, input signals corresponding to R, G and B are controlled, the barrier rib structure is formed asymmetrically or the light transmittance and dye of the color filter layer are controlled, but in this case, the luminance of the PDP is reduced.

Meanwhile, the color filter layer may be replaced by a black stripe layer. However, the black strip layer has a small aperture plane, a light emitting efficiency of the PDP is degraded.

As mentioned above, the conventional PDP has the following problems.

That is, since the color filter layer is additionally included, the fabrication process of the PDP is complicated.

In addition, since the light transmittance of the B visible light is relatively low compared to the R and G visible light, the color temperature of the PDP is low.

SUMMARY OF THE INVENTION

Therefore, one object of the present invention is to provide an upper dielectric layer of a PDP formed containing a colorant capable of controlling a light transmittance to thereby enhance a color temperature of the PDP, and its fabrication method.

Another object of the present invention is to provide an upper dielectric layer of a PDP formed containing a colorant capable of controlling a light transmittance to thereby enhance a color purity of the PDP, and its fabrication method.

Still another object of the present invention is to provide an upper dielectric layer of a PDP formed containing a colorant capable of controlling a light transmittance to thereby enhance a contrast of the PDP, and its fabrication method.

Yet another object of the present invention is to provide an upper dielectric layer of a PDP formed containing a colorant as much as a prescribed rate capable of controlling a light transmittance to thereby simplify a fabrication process of the PDP, and its fabrication method.

To achieve these and other advantages and in accordance with the purpose of the present invention, as embodied and broadly described herein, there is provided a front substrate of a PDP including a colorant-added upper dielectric layer.

To achieve the above objects, there is also provided a method for fabricating a front substrate of a PDP including: forming a colorant-added upper dielectric layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A PDP having an upper dielectric layer containing a colorant that is able to control a light transmittance to thereby enhance a color temperature, color purity and a contrast, and a fabrication method of the upper dielectric layer in accordance with a preferred embodiment of the present invention will now be described with reference to the accompanying drawings.

Figure 1:
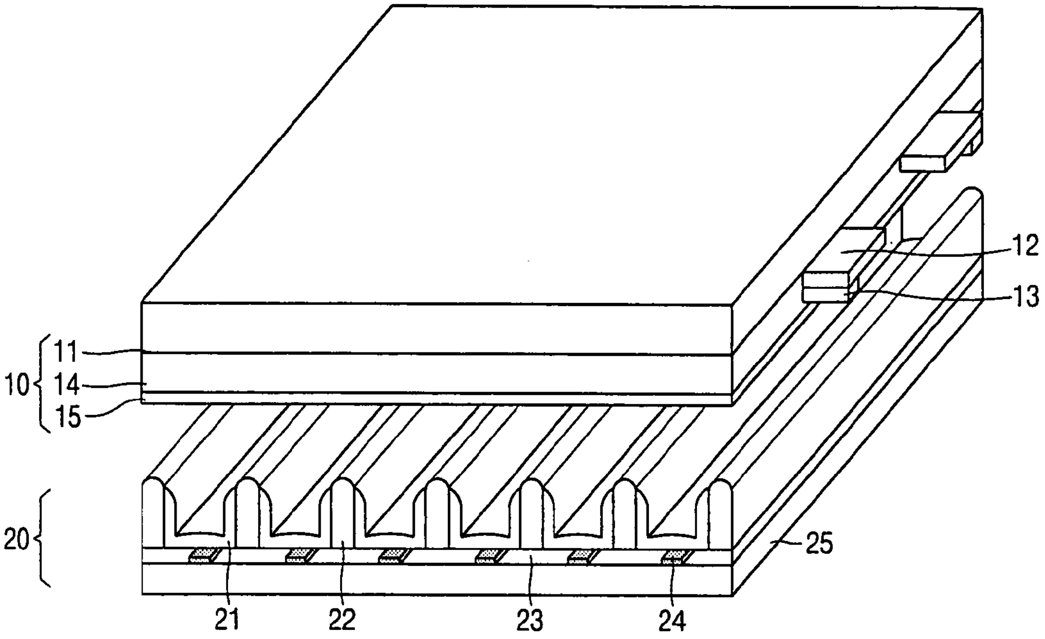
FIG. 1 CONVENTIONAL ART
FIG. 1 is a view showing a structure of a general three-electrode AC surface discharge type PDP.
Figure 2:
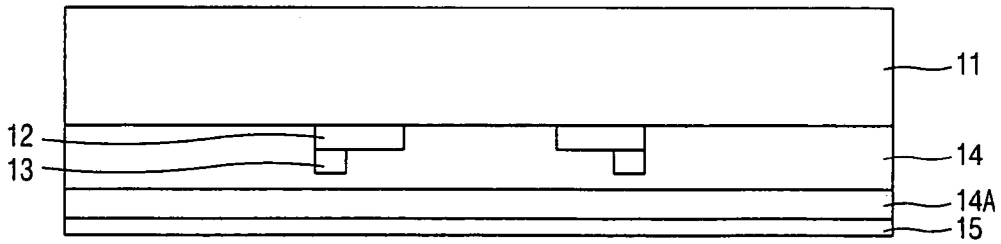
FIG. 2 CONVENTIONAL ART
FIG. 2 is a sectional view showing a front substrate of a PDP in accordance with a conventional art.
Figure 3:
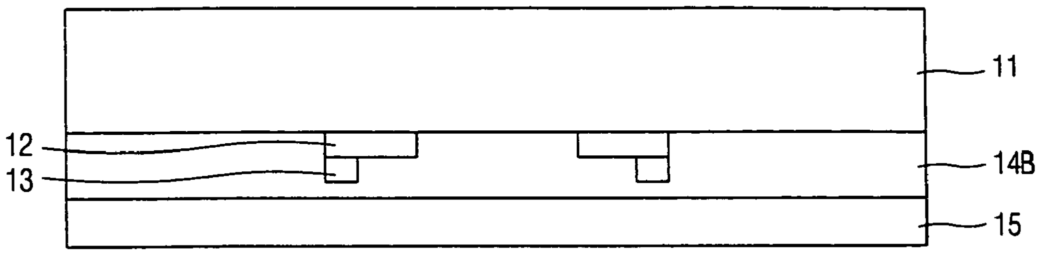
FIG. 3 is a sectional view showing a front substrate of a PDP in accordance with the present invention.

FIG. 3 is a sectional view showing a front substrate of a PDP in accordance with the present invention.

As shown in FIG. 3, a front substrate of a PDP in accordance with the present invention includes: an upper glass substrate 11; transparent electrode 12 and a bus electrode 13 formed on the upper glass substrate 11; an upper dielectric layer 14B entirely formed on the transparent and bus electrode-formed upper glass substrate 11 and containing a colorant; and a protection layer 15 formed on the upper dielectric layer 14B.

A method for fabricating the front substrate of the PDP constructed as described above will now be explained with reference to FIG. 4.

Figure 4:
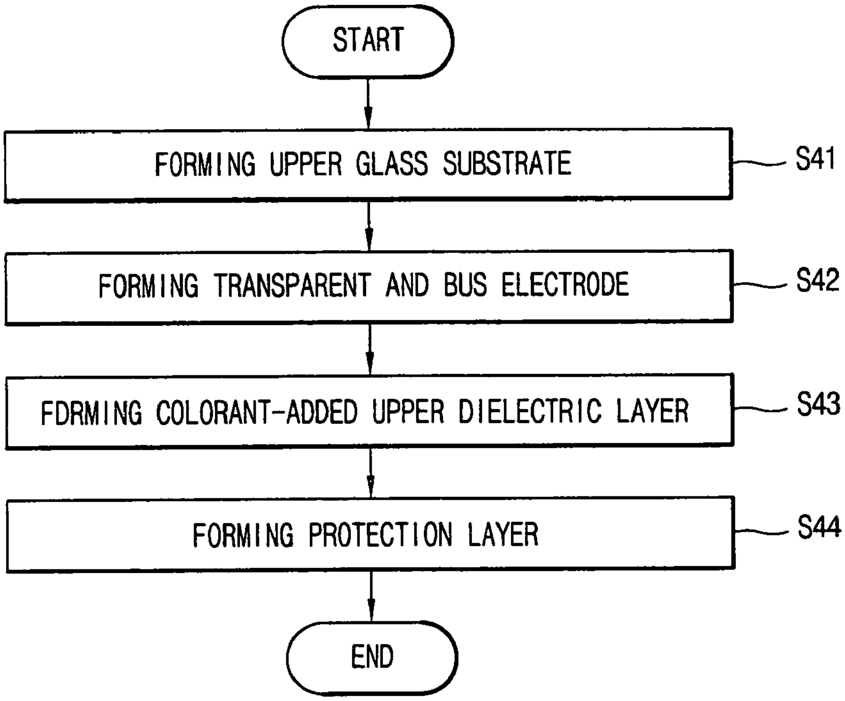
FIG. 4 is a flow chart of a method for fabricating the front substrate of the PDP in accordance with the present invention.

As shown in FIG. 4, the method for fabricating the front substrate of the PDP in accordance with the present invention includes: forming the upper glass substrate 11 (step S41); forming the transparent electrode 12 and bus electrode 13 on the upper glass substrate 11 (step S42); forming the upper dielectric layer 14B containing a colorant at a prescribed rate entirely on the transparent and bus electrode-formed upper glass substrate 11 (step S43); and forming the protection layer 15 on the upper dielectric layer 14B.

The method for fabricating the front substrate of the PDP will now be described.

First, the upper glass substrate 11 is formed (step S41), on which the transparent electrode 12 and the bus electrode 13 are formed (step S42).

And then, the upper dielectric layer 14B with the colorant added as much as a prescribed rate is formed entirely on the upper glass substrate 11 on which the transparent electrode 12 and the bus electrode 13 have been formed.

A method for fabricating the upper dielectric layer of the PDP will now be described with reference to FIG. 5.

Figure 5:
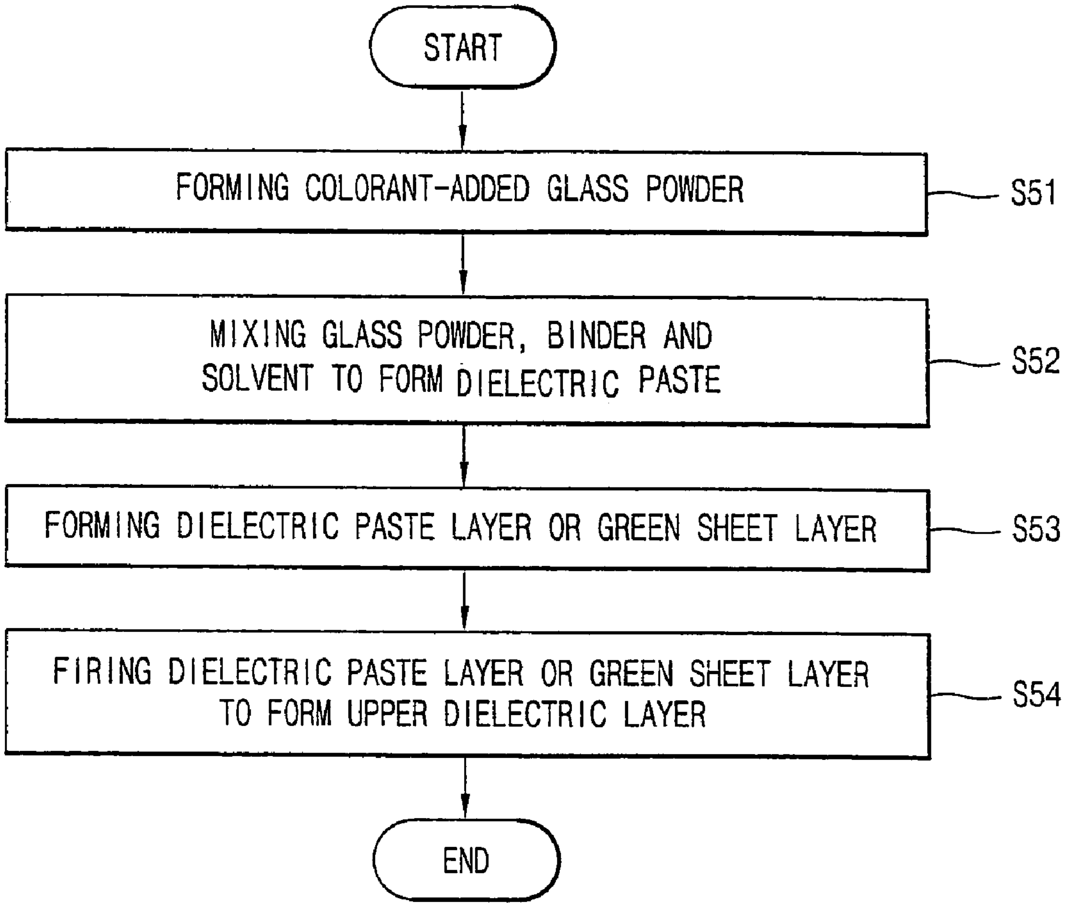
FIG. 5 is a flow chart of a method for fabricating an upper dielectric layer of FIG. 3.

FIG. 5 is a flow chart of a method for fabricating an upper dielectric layer of FIG. 3.

As shown in FIG. 5, the method for forming an upper dielectric layer of the PDP in accordance with the present invention includes: forming glass powder containing a colorant at a prescribed rate (step S51); forming a dielectric paste by mixing the glass powder, binder and solvent (step S52); coating the dielectric paste entirely on the transparent and bus electrode-formed upper glass substrate to form a dielectric paste layer or a green sheet layer (step S53); and firing the dielectric paste layer or the green sheet layer to form an upper dielectric layer (step S54).

The method for forming the upper dielectric layer of the PDP in accordance with the present invention will now be described in detail.

First, glass is fabricated by mixing a colorant that can control a light transmittance at a prescribed rate to parent glass. Herein, preferably, a material used as the colorant includes at least one of $Nd_2O_3$ and cobalt oxide such as CoO, $Co_3O_4$ and $Co_2O_3$. The prescribed rate means a ratio of the colorant to the parent glass, and $Nd_2O_3$ is added in the range of 0~40 wt % and cobalt oxide such as CoO, $Co_3O_4$ and $Co_2O_3$ is added in the range of 0~10 wt %.

As shown in Table 1~Table 4 shown below, the parent glass comprises one of components shown in the Table 1 and Table 2 ($PbO—B_2O_3—SiO_2—Al_2O_3$—RO-based glass), Table 3 ($P_2O_5—B_2O_3$—ZnO-based glass) and Table 4 (ZnO—$B_2O_3$—RO-based glass). The unit representing each component in Table 1 to Table 3 is weight %.

The method for adding the colorant that can control the light transmittance to the parent glass at a prescribed rate will now be described with reference to first to fourth embodiments of the present invention.

First, in the method for adding a colorant to parent glass in accordance with a first embodiment, $Nd_2O_3$ is added in the range of 0~40 wt % to $PbO—B_2O_3—SiO_2—Al_2O_3$—RO-based glass as shown in Table 1. Herein, RO, a constituent of the parent glass in Table 1, is one of BaO, SrO, $La_2O$, $Bi_2O_3$, MgO and ZnO.

TABLE 1

| PbO | $B_2O_3$ | $SiO_2 + Al_2O_3$ | RO |
|---|---|---|---|
| 50 | 10 | 25 | 15 |
| 55 | 15 | 20 | 10 |
| 60 | 20 | 10 | 10 |
| 65 | 10 | 20 | 5 |

A result of an experimental measurement of the light transmittance of the PDP in accordance with the first embodiment of the present invention will now be described with reference to FIG. 6.

Figure 6:
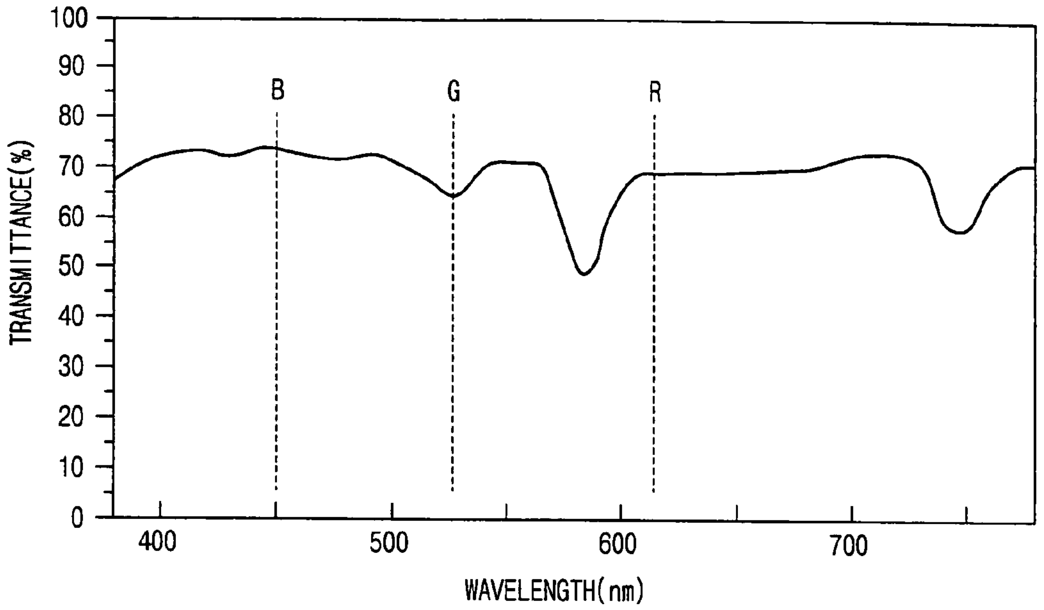
FIG. 6 is a graph showing an experimentation result of the light transmittance of a PDP in accordance with a first embodiment of the present invention.

FIG. 6 is a graph showing an experimentation result of the light transmittance of a PDP in accordance with a first embodiment of the present invention.

As shown in FIG. 6, a light transmittance of the orange-colored visible light (585 nm) is lower than that of the blue visible light (454 nm), green visible light (525 nm) and red visible light (611 nm). Accordingly, through this experimentation result, an improvement of the color temperature, color purity and contrast of the PDP in accordance with the present invention can be expected.

Second, in a method for adding a colorant to parent glass in accordance with the second embodiment of the present invention, cobalt oxide is added in the range of 0~10 wt % to $PbO—B_2O_3—SiO_2—Al_2O_3$—RO-based glass as shown in Table 2. Herein, cobalt oxide is one of CoO, $Co_3O_4$ and $Co_2O_3$ each having a lower light transmittance of the red visible light (611 nm) and green visible light (525 nm) than that of the blue visible light (454 nm).

TABLE 2

| PbO | $B_2O_3$ | $SiO_2 + Al_2O_3$ | RO |
|---|---|---|---|
| 65 | 10 | 25 | 0 |
| 60 | 12.5 | 22.5 | 5 |
| 55 | 15 | 20 | 10 |
| 50 | 20 | 17.5 | 12.5 |

A result of an experimental measurement of the light transmittance of the PDP in accordance with the first embodiment of the present invention will now be described with reference to FIG. 7.

Figure 7:
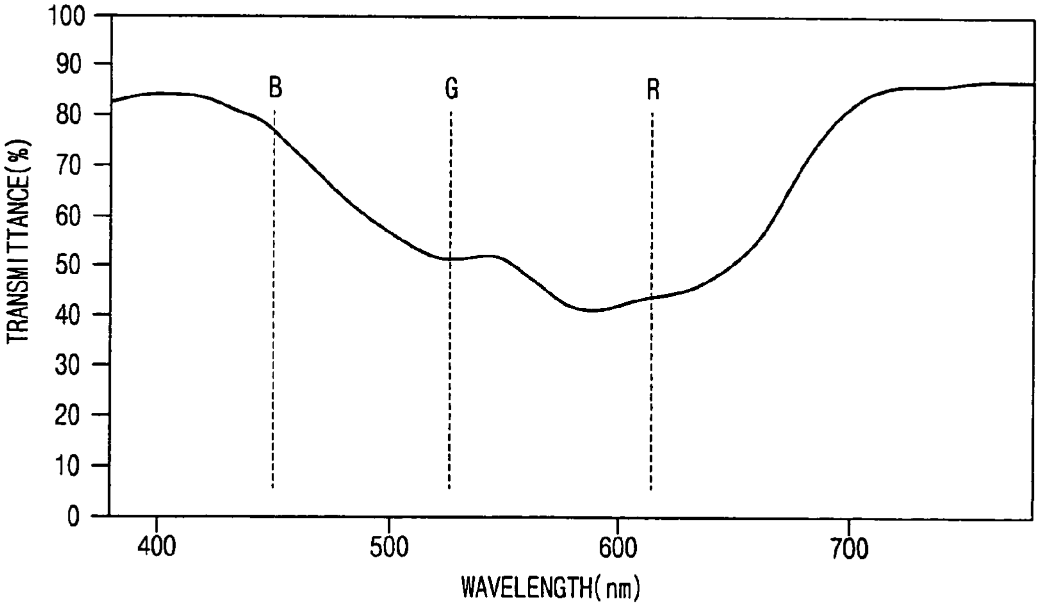
FIG. 7 is a graph showing an experimentation result of the light transmittance of a PDP in accordance with a second embodiment of the present invention.

FIG. 7 is a graph showing an experimentation result of the light transmittance of a PDP in accordance with a second embodiment of the present invention.

As shown in FIG. 7, a light transmittance of the blue visible light (454 nm) is higher than that of the red visible light (611 nm) and green visible light (525 nm). Accordingly, through this experimentation result, a remarkable improvement of the color temperature, color purity and contrast of the PDP can be expected.

Third, in a method for adding a colorant to parent glass in accordance with a third embodiment, both $Nd_2O_3$ in the range of 0~40 wt % and cobalt oxide in the range of 0~10 wt % are added to $P_2O_5—B_2O_3$—ZnO-based glass as shown in Table 3.

TABLE 3

| wt % | | |
|---|---|---|
| $B_2O_3$ | ZnO | $P_2O_5$ |
| 00.0 | 46.2 | 53.8 |
| 03.3 | 44.7 | 52.0 |
| 06.8 | 43.1 | 50.1 |
| 10.4 | 41.4 | 48.2 |
| 14.1 | 39.7 | 46.2 |
| 18.0 | 37.9 | 44.1 |
| 22.0 | 36.1 | 41.9 |

Fourth, in a method for adding a colorant to parent glass in accordance with a fourth embodiment of the present invention, both $Nd_2O_3$ in the range of 0~40 wt % and cobalt oxide in the range of 0~10 wt % are added to $ZnO—B_2O_3$—RO-based glass as shown in Table 4. Herein, RO, a constituent of parent glass of Table 4, is one of BaO, SrO, $La_2O$, $BiO_3$, MgO and ZnO.

TABLE 4

| ZnO | $B_2O_3$ | RO |
|---|---|---|
| 19.8 | 42.4 | 37.8 |
| 24.6 | 37.9 | 37.5 |
| 29.3 | 33.4 | 37.3 |
| 34.0 | 29.0 | 37.0 |

The thusly fabricated glass is crushed to a prescribed particle size to from glass powder. The prescribed particle size is preferably in the range of 1~5 μm.

The formed glass powder is mixed together with an ethylcellulose binder in a solvent such as α-terpineol or BCA (Butyl Cabitol Acetate) which dissolves the binder, to form a dielectric paste.

At this time, the formed dielectric paste is coated at the entire surface of the upper glass substrate on which the transparent electrode and bus electrode have been formed. This will now be described in detail.

First, the formed dielectric paste is coated at the entire surface of the transparent and bus electrode-formed upper glass substrate through a screen-printing method or a thick film coating method, to form a dielectric paste layer.

Second, the dielectric paste is shaped in a sheet by a doctor blading method and then dried to be formed as a green sheet. The green sheet is coated at the entire surface of the transparent and bus electrode-formed upper glass substrate by a laminating method, to form a green sheet layer.

The thusly formed dielectric paste layer or the green sheet layer is fired at 550° C.~600° C. for 10~30 minutes to be formed as an upper dielectric layer containing $Nd_2O_3$ and cobalt oxide to serve as a color filter. The thickness of the upper dielectric layer is approximately 20~40 μm.

As so far described, the front substrate of the PDP and its fabrication method in accordance with the present invention has the following advantages.

That is, first, since the upper dielectric layer contains the light transmittance-controllable colorant at a prescribed rate, its light transmittance can be controlled and thus a color purity of the PDP can be enhanced.

Second, since the upper dielectric layer contains the light transmittance-controllable colorant at a prescribed rate, light transmittance of the blue visible light is enhanced and thus a color temperature of the PDP can be improved.

Third, since the upper dielectric layer contains the light transmittance-controllable colorant at a prescribed rate, a surface reflection of an external light is prevented and thus a contrast of the PDP can be enhanced.

Fourth, since the upper dielectric layer contains the light transmittance-controllable colorant at a prescribed rate, a filter layer is not necessary and thus a fabrication process of the PDP can be simplified.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A front substrate of a plasma display panel (PDP) including a colorant-added upper dielectric layer, wherein the colorant is $Co_2O_3$.

2. The front substrate of claim 1, wherein the colorant controls a light transmittance.

3. The front substrate of claim 1, wherein $Co_2O_3$ is added in the range of 0~10 wt %.

4. The front substrate of claim 1, wherein the colorant is a material for controlling a light transmittance.

5. The front substrate of claim 1, wherein the upper dielectric layer comprises a glass powder, wherein the glass powder is one of $PbO—B_2O_3—SiO_{2—Al2}O_3$-RO group, $P_2O_5—B_2O_3—ZnO$ group, $ZnO—B_2O_3$-RO group, and $PbO—B_2O_3—SiO_2—Al_2O_3—BaO$ group.

6. The front substrate of claim 5, wherein the upper dielectric layer is formed by mixing 65 wt % of PbO, 10 wt % of $B_2O_3$, 20 wt % of $SiO_2$ and $Al_2O_3$ and 5 wt % of RO.

7. The front substrate of claim 6, wherein the RO is one of BaO, SrO, $La_2O$, $Bi_2O_3$, MgO and ZnO.

8. The front substrate of claim 5, wherein the upper dielectric layer is formed by mixing 41.9 wt %~52.0 wt % of $P_2O_5$, 3.3 wt %~22.0 wt % of $B_2O_3$ and 36.1 wt %~44.7 wt % of ZnO.

9. The front substrate of claim 5, wherein the upper dielectric layer is formed by mixing 34.0 wt % of ZnO, 29 wt % of $B_2O_3$ and 37.0 wt % of RO, wherein the RO is one of BaO, SrO, $La_2O$, $Bi_2O_3$, MgO and ZnO.

10. A dielectric composition for an upper dielectric layer in a plasma display panel (PDP) comprising:

a glass powder, wherein the glass powder includes $P_2O_5—B_2O_3—ZnO$ group; and a colorant, wherein the colorant is $Co_2O_3$.

11. The dielectric composition of claim 10, wherein the upper dielectric layer is formed by mixing 41.9 wt %~52.0 wt % of $P_2O_5$, 3.3 wt %~22.0 wt % of $B_2O_3$ and 36.1 wt %~44.7 wt % of ZnO.

12. The dielectric composition of claim 10, wherein $Co_2O_3$ is added in the range of 0 wt %~10 wt %.

13. An upper dielectric layer in a plasma display panel (PDP) comprising:

a glass powder, wherein the glass powder is one of $PbO—B_2O_3—SiO_2Al_2O_5$-RO group, $P_2O_5—B_2O_3—ZnO$ group, and $ZnO—B_2O_3$—RO group; and a colorant, wherein the colorant is $Co_2O_3$.

14. The upper dielectric layer of claim 13, wherein the upper dielectric layer is formed by mixing 41.9 wt %~52 wt % of $P_2O_5$, 3.3 wt %~22.0 wt % of $B_2O_3$ and 36.1 wt %~44.7 wt % of ZnO.

15. The upper dielectric layer of claim 13, wherein $Co_{2O3}$ is added in the range of 0 wt %~10 wt %.

16. A plasma display panel comprising a front substrate, and an upper dielectric layer on the front substrate, the upper dielectric layer comprising:

a glass powder, wherein the glass powder is $P_2O_5—B_2O_3—ZnO$ group; and a colorant, wherein the colorant is $Co_2O_3$.

17. The plasma display panel of claim 16, wherein the upper dielectric layer is formed by mixing 41.9 wt %~52.0 wt % of $P_2O_5$, 3.3 wt %~22.0 wt % of $B_2O_3$ and 36.1 wt %~44.7 wt % of ZnO.

18. The plasma display panel of claim 16, wherein $Co_2O_3$ is added in the range of 0~10 wt %.

19. A method for fabricating a front substrate of a plasma display panel (PDP) comprising:

forming glass powder with a colorant added therein at a prescribed rate, wherein the colorant is $Co_2O_3$;

forming a dielectric paste by mixing the glass powder, a binder and a solvent, and wherein the glass powder is $P_2O_5—B_2O_3—ZnO$ group;

coating the dielectric paste at the entire surface of an upper glass substrate with a transparent electrode and a bus electrode formed thereon to form a dielectric paste layer; and heating the dielectric paste layer to form an upper dielectric layer of the front substrate, wherein the upper dielectric layer is formed by mixing 41.9 wt %~52.0 wt % of $P_2O_5$, 3.3 wt %~22.0 wt % of $B_2O_3$ and 36.1 wt %~44.7 wt % of ZnO.

20. The method of claim 19, wherein $Co_2O_3$ is added in the range of 0 ~10 wt %.

21. A plasma display panel (PDP) comprising a front substrate, a back substrate, and a dielectric formed on the front substrate and including $Co_2O_3$.

22. The plasma display panel (PDP) of claim 21, wherein the $Co_2O_3$ is a colorant which controls a light transmittance.

23. The plasma display panel (PDP) of claim 21, wherein the $Co_2O_3$ is added in the range of 0~10 wt % of the dielectric.

* * * * *